United States Patent [19]

Cooper et al.

[11] Patent Number: 5,350,957
[45] Date of Patent: Sep. 27, 1994

[54] ELECTRONIC SWITCH CONTROLLED BY PLURAL INPUTS

[75] Inventors: Steven W. Cooper, Dallas; George A. Truitt, Allen, both of Tex.

[73] Assignee: Texas Instrument Incorporated, Dallas, Tex.

[21] Appl. No.: 91,420

[22] Filed: Jul. 14, 1993

Related U.S. Application Data

[63] Continuation of Ser. No. 704,689, May 17, 1991, which is a continuation of Ser. No. 424,490, Oct. 20, 1989, abandoned.

[51] Int. Cl.$^5$ .................... A03K 17/687; A03K 17/56
[52] U.S. Cl. .................... 307/571; 307/572; 307/579; 307/241; 307/573
[58] Field of Search ............... 307/571, 585, 451, 443, 307/254, 241, 270, 296.8, 304; 323/224, 225, 226; 377/60

[56] References Cited

U.S. PATENT DOCUMENTS

| | | | |
|---|---|---|---|
| 3,665,320 | 5/1972 | Ohsawa et al. | 307/571 |
| 4,680,489 | 7/1987 | Stetson | 377/60 |
| 4,810,911 | 3/1989 | Noguchi | 307/571 |
| 5,042,011 | 8/1991 | Casper et al. | 307/530 |

*Primary Examiner*—Timothy P. Callahan
*Assistant Examiner*—Trong Phan
*Attorney, Agent, or Firm*—René E. Grossman; Richard L. Donaldson

[57] ABSTRACT

A switching circuit (34) is provided having first and second transistors (36, 38). A first control voltage $V_{C1}$, is applied to the gate (42) of the first transistor (36). A second control voltage, $V_{C2}$, is applied to the gate (50) of the second transistor (38). The transistors (36, 38) switch to generate the output signal, $V_{out}$, in response to the difference between the first and second control voltages.

19 Claims, 1 Drawing Sheet

5,350,957

ELECTRONIC SWITCH CONTROLLED BY PLURAL INPUTS

This application is a continuation of application Ser. No. 07/704,689, filed May 17,1991, which is a continuation of application Ser. No. 07/424,490, filed Oct. 20, 1989, now abandoned.

TECHNICAL FIELD OF THE INVENTION

This invention relates to switching circuitry and methodology, and more particularly to a circuit for switching an input signal in accordance with the difference of the control voltages applied to the switches therein.

BACKGROUND OF THE INVENTION

Quite often, low frequency switches must be designed or configured with other circuitry in order to be compatible with either TTL or CMOS logic. Accordingly, these devices must be capable of operating at typical TTL and CMOS voltage levels (i.e., 0.5/4.5 volts). Susceptibility to DC bias ripple must be minimized in order to assure that the signals passing through these switches are subject to minimal amplitude modulation which can result from the ripple voltage.

Two major transistor topologies are currently used for low frequency (DC to 6 GHz) switches The first topology is the series-shunt FET switch. This type of switch operates with negative control voltages. Thus, in order to interface with standard TTL or CMOS logic, a buffer is required since typical TTL and CMOS voltage levels are positive. Further, the current series-shunt topology is sensitive to DC bias ripple. The second topology currently used is the PIN diode technology. PIN diode switches will operate at standard TTL and CMOS logic levels, but require current drivers to source enough current for proper operation. The PIN diode topology is also susceptible to signal problems associated with DC bias ripple.

Therefore, a need has arisen for a transistor switch topology which may be efficiently utilized with TTL and CMOS logic and which is less sensitive to DC bias ripple than existing topologies. A need has further arisen to provide a switching topology which does not require additional buffers or current drivers in order to be compatible with TTL or CMOS logic.

SUMMARY OF THE INVENTION

In accordance with the present invention, a configuration and operation for a voltage controlled switch are provided which substantially eliminate or reduce disadvantages and problems associated with prior TTL or CMOS compatible low-frequency switching topologies.

A switching circuit, in accordance with the present invention, includes first and second switches having inputs for receiving first and second control voltages, respectively. The switching circuit operates in response to the difference between the first and second control voltages.

The switches of the present invention are configured to receive an input signal to be directed in accordance with the operation of both switches. The first and second switches of the present invention may comprise either a single or a plurality of transistors.

The present invention provides the technical advantage of low-frequency switching compatibility with standard TTL or CMOS logic. Another important technical advantage of the present invention is the elimination of the need of either a current driver or a buffer with the switching network. Still another technical advantage of the present invention is the reduction of amplitude modulation of the signal passing through the switching circuit due to DC bias ripple on the control voltage lines. An additional technical advantage of the present invention is that either positive or negative voltages may be used as the control voltages for causing switching of the network. In either case, it is the difference between the first and second control voltages used which causes the network to switch. Accordingly, any DC bias ripple on either of the control voltage signals has minimal affect on the signal passing through the switching network.

BRIEF DESCRIPTION OF THE DRAWINGS

For a more complete understanding of the present invention, and the advantages thereof, reference is now made to the following detailed description taken in conjunction with the accompanying drawings, in which.

DETAILED DESCRIPTION OF THE INVENTION

Figure 1:
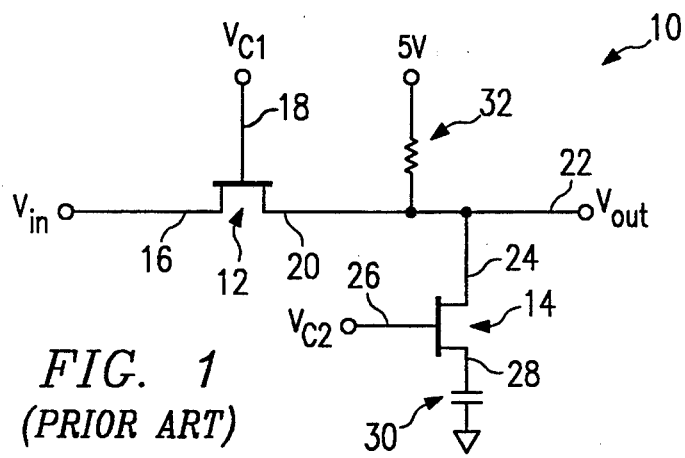
FIG. 1 illustrates a series-shunt switching circuit.
Figure 2:
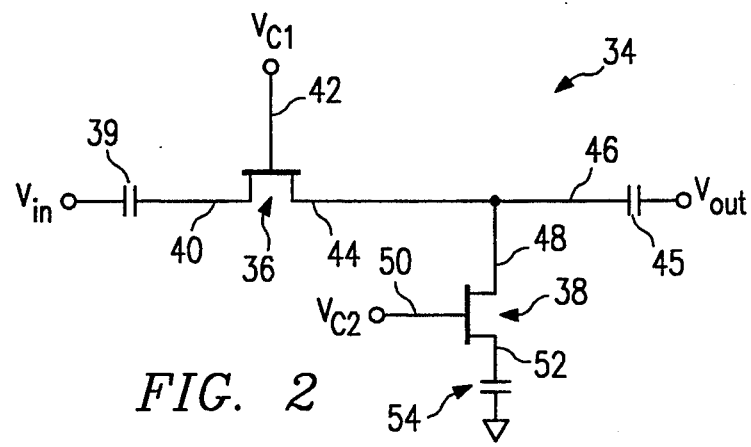
FIG. 2 illustrates a series-shunt switching circuit constructed according to the present invention.
Figure 3:
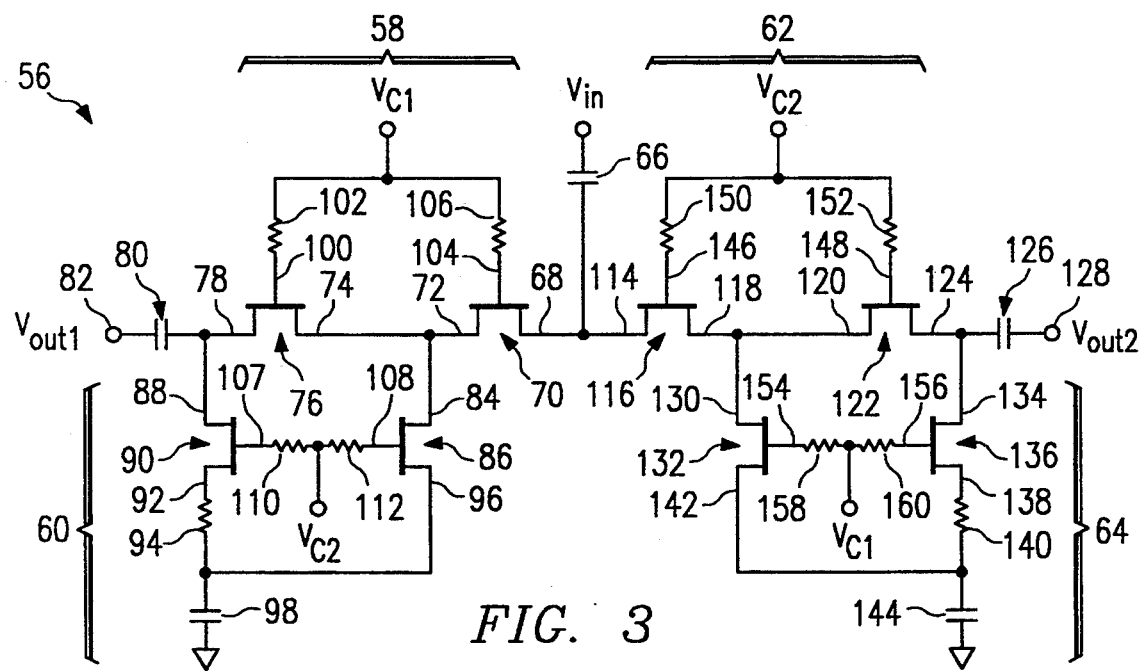
FIG. 3 illustrates a single-pole, double-throw device constructed according to the present invention.

The preferred embodiment of the present invention is best understood by referring to FIGS. 1-3 of the drawings, like numerals being used for like and corresponding parts of the various drawings.

FIG. 1 illustrates a series-shunt switching circuit indicated generally at 10. Switching circuit 10 includes a series transistor 12 and a shunt transistor 14. An input signal $V_{in}$ is connected to the first source/drain 16 of series transistor 12. The gate 18 of series transistor 12 receives a first control voltage, $V_{C1}$. The second source/drain 20 of series transistor 12 is connected to an output node 22 for generating the output signal, $V_{out}$, of switching circuit 10. Second source/drain 20 is further connected to the first source/drain 24 of shunt transistor 14. The gate 26 of shunt transistor 14 receives a second control voltage, $V_{C2}$, for switching shunt transistor 14. The second source/drain 28 of shunt transistor 14 is connected to a capacitor 30 which itself is connected to ground. A pull-up resistor 32 is connected between a 5-volt power supply signal and second node 22.

Switching circuit 10 operates such that input signal $V_{in}$ is either directed to node 22 as the output signal or the output is shunted to ground through shunt transistor 14. Therefore, there are a first and second mode of switching for switching circuit 10. In the first mode, series transistor 12 is "on" and conducts while shunt transistor 14 is "off" and therefore, in a high impedance state. In this mode, input signal $V_{in}$ will be directed to output node 22 and therefore, represent output signal $V_{out}$. In the second mode of operation, series transistor 12 is off while shunt transistor 14 is on. Accordingly, input signal $V_{in}$ encounters a high impedance from series transistor 12 and therefore will not pass through series transistor 12. Additionally, because shunt transistor 14 is on, output signal $V_{out}$ will be at ground.

The particular biasing typically used to cause the switching of circuit 10 in its two modes is as follows. In the first mode defined above (i.e., series transistor 12 on, shunt transistor 14 off), $V_{C1}=5$ volts and $V_{C2}=0$ volts. Pull-up resistor 32 places a reference potential at second source/drain 20 of series transistor 12 of five volts. Further, this same five volt reference potential is applied to first source/drain 24 of shunt transistor 14. In the first mode, gate 18 of series transistor 12 is at a potential equal to that of one of its source/drains and therefore, transistor 12 will conduct. Conversely, gate 26 of shunt transistor 14 is at a potential significantly lower than one of its source/drains and therefore, shunt transistor 14 will turn off.

The second mode of operation (i.e., series transistor 12 off, shunt transistor 14 on) is effected by reversing the control voltages $V_{C1}$ and $V_{C2}$ from the first mode described above. Thus, $V_{C1}=0$ volts while $V_{C2}=5$ volts. Because pull-up resistor 32 has biased transistors 12 and 14 as described above, series transistor 12 will turn off because its gate potential is considerably lower than the potential of one of its source/drains while shunt transistor 14 will conduct because its gate potential is equal to the potential of one its source/drains. Accordingly, input signal $V_{in}$ will encounter a high impedance while output signal $V_{out}$ will be shunted to ground through shunt transistor 14.

A considerable problem existing in the prior art switching circuit 10 occurs where a DC ripple voltage appears in control voltages $V_{C1}$ and $V_{C2}$. This ripple voltage causes the control voltages to oscillate in amplitude rather than remain constant at either five volts or zero volts. This oscillatory effect causes the transistor to either turn on or off in accordance with the oscillating DC ripple signal. For example, in the first mode described above, if a DC bias ripple of $\pm 1.5$ volts appeared on control voltage $V_{C1}$, then an amplitude modulation of the input signal $V_{in}$ would occur as follows. The DC bias ripple swing of $\pm 1.5$ volts will cause control voltage $V_{C1}$ to swing from 3.5 volts to 6.5 volts rather than remaining at 5.0 volts as typically the case during the first mode. As this ripple voltage brings $V_{C1}$ from 5.0 volts down toward 3.5 volts, series transistor 12 will begin to shut off rather than remaining on as is intended in the first mode. Accordingly, input signal $V_{in}$ will not fully conduct through series transistor 12, but rather, the amplitude of the input signal will be reduced. Similarly, a DC bias ripple may exist on control voltage $V_{C2}$. If the swing of this ripple voltage were also $\pm 1.5$ volts, $V_{C2}$ would swing from $-1.5$ volts to 1.5 volts during the first mode. Accordingly, when $V_{C2}=1.5$ volts, shunt transistor 14 would begin to turn on, thereby partially grounding output signal $V_{out}$ rather than yielding a high impedance as is expected of shunt transistor 14 during the first mode.

As the DC bias ripple swing goes positive, transistors 12 and 14 will return to the proper state and input signal $V_{in}$ will pass to output node 22. Thus, output signal $V_{out}$ modulates in amplitude in accordance with the frequency of the DC bias ripple signal. Naturally, the same degenerative signal effect occurs in the second mode, but with opposite control voltage levels applied to the series and shunt transistors 12 and 14.

It may therefore be appreciated from the above that ripple signals on the DC control voltage lines may have substantial undesirable effects on the signal being switched by the switching circuit. The prior art switching circuit utilizes a fixed reference voltage (i.e., 5 volts on pull-up resistor 32). The voltage swing on the control voltage lines due to bias ripple causes amplitude modulation when the control voltage signals move significantly away from this reference potential.

FIG. 2 illustrates a series-shunt switching circuit 34 constructed in accordance with the present invention. Switching circuit 34 includes a first transistor 36 and a second transistor 38. In FIG. 2, transistors 36 and 38 are shown as depletion mode devices. However, it is to be understood that the present invention need not be limited thereto, but rather, can also include enhancement mode devices of either N or P channel devices. In the preferred embodiment, MESFET transistors are utilized. An input signal $V_{in}$, is connected through a DC blocking capacitor 39 to the first source/drain 40 of transistor 36. The gate 42 of first transistor 36 is operable to receive a first control voltage, $V_{C1}$. The second source/drain 44 of transistor 36 is connected to a DC blocking capacitor 45 which is connected to the output node 46 of switching circuit 34. The first source/drain 48 of transistor 38 is also connected to output node The gate 50 of second transistor 38 is operable for receiving a second control voltage, $V_{C2}$. A second source/drain 52 of second transistor 38 is connected to a DC isolating capacitor 54 which is connected to ground.

First and second transistors 36 and 38 of switching circuit 34 operate to receive input signal $V_{in}$ and transmit an output signal $V_{out}$ to output node 46 in accordance with control voltages $V_{C1}$ and $V_{C2}$. It should be noted that in contrast to the prior art, only control voltages $V_{C1}$ and $V_{C2}$ cause switching circuit 34 to switch, and that there is no other reference voltage used to bias the network (as compared to the 5-volt potential connected to pull-up resistor 32 shown in FIG. 1).

The present invention includes a first and second switch which operate in response to the difference between the magnitude of the control voltages for the first and second switch. The operation of the switches is generally in a reciprocal fashion, that is, one switch is on while the other is off. Accordingly, in the preferred embodiment of FIG. 2, transistors 36 and 38 will switch in response to the voltage difference between $V_{C1}$ and $V_{C2}$. The switches will properly operate so long as the difference between the respective control voltages is greater than or equal to the pinchoff voltages of the particular switches implemented in switching circuit 34. It should be noted that because only the voltage difference is of concern, then either positive or negative voltages may be used to effect switching of the circuit.

Switching circuit 34 operates in two modes. The first mode permits input signal $V_{in}$ to be conducted to output node 46 as output signal $V_{out}$. In the second mode, the input signal is not permitted to pass through the switching network to output node 46; and further, output signal $V_{out}$ is grounded. Either the first or second mode may be accomplished where the difference between control voltages $V_{C1}$ and $V_{C2}$ is greater than approximately 1.7 volts.

The detailed operation of switching circuit 34 is as follows. For exemplary purposes, it is assumed that the pinchoff voltage of transistors 36 and 38 is 1.7 volts. Thus, if control voltage $V_{C1}=5$ volts then the first mode will occur so long as control voltage $V_{C2}$ is less than approximately 3.3 volts (i.e., 5 volts $-1.7$ volts $=3.3$ volts). For exemplary purposes, let $V_{C2}=0$ volts, thereby ensuring that there is a difference between the two control voltages of greater than the pinchoff voltage, 1.7 volts. In the instance where $V_{C1} = 5$ volts and $V_{C2} = 0$ volts, second source/drain 44 of transistor 36 will be at approximately 4.4 volts assuming that the diode drop between gate 42 and source/-drain 44 is on the order of $-0.6$ volts. The 4.4 volts exists because source/drain 44 is floating and there will be a slight voltage drop between gate 42 and source/-drain 44. Accordingly, the gate potential is larger than that of the source/drains for transistor 36 and, therefore, transistor 36 will be on. With reference to transistor 38, second source/drain 52 will float due to DC isolating capacitor 54. Further, the gate voltage will be significantly less than the 4.4 volts on first source/drain 48 and, therefore, transistor 38 will turn off. Thus, with transistor 36 on and transistor 38 off, input signal $V_{in}$ will conduct to output node 46 and a high impedance will be realized through transistor 38.

The second mode of operation may be effected by simply reversing the control voltages, that is, by setting $V_{C1}$ 0 volts and $V_{C2}$ 5 volts. In this instance the five volts at gate 50 of transistor 38 will cause a voltage of approximately 4.4 volts on first source/drain 48 of transistor 38 and second source/drain 44 of transistor 36. Similar to the operation of the first mode discussed above, this potential will ensure proper operation of both of the transistors. Accordingly, in this instance, transistor 36 will be off because its gate voltage (i.e., 0 volts) is significantly less than the potential at one of its source/drains (i.e., the 4.4 volts at second source/drain 44). Transistor 38 will conduct because its gate voltage of 5 volts is larger than the potential at its first source/-drain 48. Thus, transistor 36 yields a high impedance to input signal $V_{in}$ while transistor 38 connects output node 46 to ground.

Because the present invention eliminates the need for a reference potential and permits the transistors therein to float, the modulation due to the reasons discussed in connection with the prior art is substantially reduced. Recall that the amplitude modulation occurred in the prior art when the bias ripple voltage caused the control voltages to swing below the reference potential. In other words, for transistor 12 of FIG. 1, that transistor began to turn off when its control voltage began to swing below 5 volts. The present invention eliminates the reference potential and therefore, the amplitude modulation associated therewith.

The transistors of the present invention switch relative to the control voltages of opposing transistors and not relative to a reference potential. For example, in the first mode of operation discussed in connection with FIG. 2, if a bias ripple signal were to cause $V_{C1}$ to drop from five volts to 3.5 volts while $V_{C2}$ remained at 0 volts, the transistor operation would remain constant because there would still be a voltage differential of greater than 1.7 volts for the opposing transistors. Thus, transistor 36 would continue to conduct while transistor 38 remained off. Further, even if ripple voltage caused $V_{C1}$ to swing upward to 1.5 volts, there would still be a differential voltage of greater than 1.7 volts, and consequently, proper switch operation would be maintained. It should also be noted that by using transistors with low pinchoff voltages, immunity to any ripple voltage is improved. This occurs because the control voltages may swing in magnitude toward one another due to ripple, while proper operation will continue so long as the difference between the swinging control voltages is greater than the pinchoff voltage of the transistors. For example, if the pinchoff voltage chosen equals 1.0 volts ripple can cause $V_{C1}$ to swing down 4.0 volts to 1.0 volts and proper operation will continue so long as $V_{C2}$ remains under 0 volts (i.e. because $V_{C2} - V_{C1}$ will be greater than or equal to the pinchoff voltage chosen).

The present invention need not be limited to the series-shunt configuration illustrated in FIG. 2. Instead, the invention applies to any switching circuit having at least a first and second switch whereby one switch conducts while the other remains off in response to the difference between the control voltages for each switch. FIG. 3 illustrates an alternative inventive embodiment in which a single-pole, double-throw (SPDT) device 56 is constructed in accordance with the present invention.

SPDT device 56 generally includes four switches 58, 60, 62 and 64. Each of the four switches 58, 60, 62 and 64 includes two transistors. The input signal $V_{in}$, is connected through a blocking capacitor 66 to the first source/drain 68 of a transistor 70. The second source/-drain 72 of transistor 70 is connected to the first source/drain 74 of a transistor 76. A second source/drain 78 of transistor 76 is connected through a blocking capacitor 80 to a first output node 82.

Second source/drain 72 of transistor 70 is connected to the first source/drain 84 of a transistor 86. Second source/drain 78 of transistor 76 is connected to the first source/drain 88 of a transistor 90. Second source/drain 92 of transistor 90 is connected through a resistor 94 to the second source/drain 96 of transistor 86. Further, second source/drain 96 of transistor 86 is connected to a DC isolating capacitor 98 which is connected to ground. The gate 100 of transistor 76 is connected through a resistor 102 to a first control voltage, $V_{C1}$. Similarly, the gate 104 of transistor 70 is connected through a resistor 106 to first control voltage $V_{C1}$. The gate 107 of transistor 90 and the gate 108 of transistor 86 are connected through resistors 110 and 112, respectively, to a second control voltage, $V_{C2}$.

The connection of input signal V. to switches 62 and 64 mirrors that of the connections mentioned above in reference to the components of switches 58 and 60. Accordingly, input signal $V_{in}$ is connected through blocking capacitor 66 to the first source/drain 114 of a transistor 116. The second source/drain 118 of transistor 116 is connected to the first source/drain 120 of a transistor 122. The second source/drain 124 of transistor 122 is connected through a blocking capacitor 126 to a second output node 128. Second source/drain 118 of transistor 116 is connected to the first source/drain 130 of a transistor 132. Second source/drain 124 of transistor 122 is connected to the first source/drain 134 of a transistor 136. The second source/drain 138 of transistor 136 is connected through a resistor 140 to the second source/drain 142 of transistor 132. Second source/drain 142 of transistor 132 is further connected to a DC isolating capacitor 144 which is connected to ground.

The gate 146 of transistor 116 and the gate 148 of transistor 122 are connected through resistors 150 and 152, respectively, to the second control voltage, $V_{C2}$. The gate 154 of transistor 132 and the gate 156 of transistor 136 are connected through resistors 158 and 160, respectively, to first control voltage $V_{C1}$.

SPDT device 56 of FIG. 3 operates in accordance with the same inventive concepts described in connection with FIG. 2. Generally, input signal $V_{in}$ is transmitted to either first output node 82 or second output node 128. In a first mode of operation, input signal $V_{in}$ is directed to first output node 82 while second output node 128 is grounded. Conversely, in a second mode of operation, input signal $V_{in}$ is directed to second output node 128 while first output node 82 is grounded. The switching concepts mentioned above activate switches 58, 60, 62 and 64 such that these two modes are effected. For example, in the first mode, first control voltage $V_{C1}$ ms set at a voltage of at least 1.7 volts greater than that of second control voltage $V_{C2}$. For example if $V_{C1}=5$ volts and $V_{C2}=0$ volts, switch 58 and switch 64 will conduct while switch 60 and switch 62 will turn off, thereby rendering a high impedance. Accordingly, switch 58 conducts input signal $V_{in}$ through transistors 70 and 76 to first output node 82. Further, switches 60 and 62 are in a high impedance state while switch 64 connects second output node 128 to ground.

The detailed operation of the first mode is as follows. Where $V_{C1}=5$ volts and $V_{C2}=0$ volts, transistors 70 and 76 will turn on because the gates thereof are at a potential equal or greater than the source/drain potentials of those transistors. Since $V_{C2}=0$ volts, then the gates of transistors 86 and 90 will be at a lesser potential than that of the source/drains of those transistors and therefore, those transistors will remain off. Accordingly, the input signal is permitted to pass through transistors 70 and 76 to first output node 82. Because first control voltage $V_{C1}$ is further used to control transistors 132 and 136 of switch 64, then during the first mode, these transistors will turn on thereby connecting second output 128 to ground. Similarly, because second control voltage $V_{C2}$ is used to control transistors 116 and 122, these transistors will turn off thereby yielding a high impedance to input signal $V_{in}$.

The second mode of operation for SPDT device 56 will occur where $V_{C2}=5$ volts and $V_{C1}=0$ volts. In the second mode of operation, the transistors of SPDT device 56 operate in an opposite fashion as compared to the first mode. Accordingly, switches 60 and 62 conduct while switches 58 and 64 render a high impedance. As discussed in connection with FIG. 2, the use of the differential voltage in order to control switching substantially reduces the effect of any bias ripple voltage existing on the first and second control voltage signals. Accordingly, SPDT switch 56 of FIG. 3 will switch the input signal with minimal amplitude modulation thereof.

Although the present invention has been described in detail, it should be understood that various changes, substitutions and alterations can be made herein without departing from the spirit and scope of the invention as defined by the appended claims. In particular, numerous switching circuits may be realized in accordance with the present invention wherein the reciprocating switching occurs due to the difference between the control voltages applied to the switches therein.

What is claimed is:

1. A switching circuit, comprising:
   (a) an input terminal and an output terminal;
   (b) a first switch having a current path coupled to said input terminal and said output terminal and having an input for receiving a first control voltage;
   (c) a second switch having a current path coupled to said current path of said first switch and to said output terminal and having an input for receiving a second control voltage, only one of said first switch and said second switch operable to conduct in response to a voltage difference between said first and second control voltages;
   (d) a first capacitor coupled between said input terminal and said current path of said first switch; and
   (e) a second capacitor coupled between said output terminal and said current path of said first switch;
   (f) wherein said first switch comprises a first and second transistor each having a gate, said first and second transistor gates coupled together as said input for said first switch, and said second switch comprises a third and fourth transistor each having a gate, said third and fourth transistor gates coupled together as said input for said second switch.

2. The switching circuit of claim 1 wherein said first and second transistors further each include a first and second source/drain;
   said first source/drain of said first transistor receiving an input signal;
   said first source/drain of said second transistor transmitting an output signal; and
   said second source/drain of said first transistor coupled to said second source/drain of said second transistor.

3. The switching circuit of claim 2 wherein said third and fourth transistors further each comprise a first and second source/drain;
   said first source/drain of said third transistor coupled to said first source/drain of said fourth transistor;
   said second source/drain of said third transistor coupled to said second source/drain of said first transistor; and
   said second source/drain of said fourth transistor coupled to said first source/drain of said second transistor.

4. The switching circuit of claim 3 and further including a capacitor coupled between said first source/drain of both of said third and fourth transistors and ground.

5. A switching circuit, comprising:
   (a) an input terminal and an output terminal;
   (b) a first switch having a current path coupled to said first output terminal and having an input for receiving a first control voltage;
   (c) a second switch having a current path coupled to said current path of said first switch, said output terminal and a source of reference voltage and having an input for receiving a second control voltage, only one said first switch of said second switch operable to conduct in response to a voltage difference between said first and second control voltages;
   (d) a first capacitor coupled between said output terminal and said current path of said first switch;
   (e) a third switch coupled between the current path of said first switch and said reference voltage source having an input for receiving said second control voltage;
   (f) a fourth switch coupled between the current paths of said first and third switches and said input terminal having an input for receiving said first control voltage, only one of said third switch and said fourth switch being operable to conduct in response to said difference between said first and second control voltages.

6. A switching circuit, comprising:
   (a) an input terminal and an output terminal;
   (b) a first transistor coupled to said input terminal and having a gate for receiving a first control voltage and having a first and second source/drain;
   (c) a second transistor associated with said first transistor, coupled to said output terminal and having a gate for receiving a second control voltage and having a first and second source/drain;

(d) only one of said first transistor or said second transistor conducting responsive to the difference between said first and second control voltages;

(e) a first capacitor coupled between said input terminal and said first transistor;

(f) a second capacitor coupled between said output terminal and said second transistor;

(g) a third transistor having a gate for receiving said first control voltage and having a first and second source/drain; and (h) a fourth transistor having a gate for receiving said second control voltage and having a first and second source/drain;

(i) only one of said third transistor and said fourth transistor conducting responsive to the difference between said first and second control voltages.

7. A switching circuit, comprising:
a first switch having an input for receiving a first control voltage;
a second switch associated with said first switch and having an input for receiving a second control voltage, only one of said first and said second switch operable to conduct in response to the difference between said first and second control voltages;
said first switch comprising first and second transistors each having a gate, said first and second transistor gates coupled together as said input for said first switch, and said second switch comprising third and fourth transistors each having a gate, said third and fourth transistor gates coupled together as said input for said second switch.

8. The switching circuit of claim 7 wherein said first and second transistors further each include a first and second source/drain;
said first source/drain of said first transistor receiving an input signal;
said first source/drain of said second transistor transmitting an output signal; and
said second source/drain of said first transistor coupled to said second source/drain of said second transistor.

9. The switching circuit of claim 8 wherein said third and fourth transistors further each comprise a first and second source/drain;
said first source/drain of said third transistor coupled to said first source/drain of said fourth transistor;
said second source/drain of said third transistor coupled to said second source/drain of said first transistor; and
said second source/drain of said fourth transistor coupled to said first source/drain of said second transistor.

10. The switching circuit of claim 9 further including a capacitor coupled between said first source/drain of both of said third and fourth transistors and ground.

11. A switching circuit as set forth in claim 7 further including an input terminal coupled to said first switch and an output terminal coupled to said second switch, a first capacitor coupled between said input terminal and said first switch and a second capacitor coupled between said output terminal and said second switch.

12. A switching circuit as set forth in claim 8 further including an input terminal coupled to said first switch and an output terminal coupled to said second switch, a first capacitor coupled between said input terminal and said first switch and a second capacitor coupled between said output terminal and said second switch.

13. A switching circuit as set forth in claim 9 further including an input terminal coupled to said first switch and an output terminal coupled to said second switch, a first capacitor coupled between said input terminal and said first switch and a second capacitor coupled between said output terminal and said second switch.

14. A switching circuit as set forth in claim 10 further including an input terminal coupled to said first switch and an output terminal coupled to said second switch, a first capacitor coupled between said input terminal and said first switch and a second capacitor coupled between said output terminal and said second switch.

15. A switching circuit, comprising:
(a) an input terminal, an output terminal and a floating switching circuit coupled between said input terminal and said output terminal, said floating switching circuit comprising:
(i) a first current path;
(ii) a first switch having an input end and an output end disposed in said first current path controlling current flow in said first current path, said input end of said first switch coupled to said input terminal and said output end of said first switch coupled to said output terminal, said first switch having a control input for receiving a first control voltage to control operation of said first switch;
(iii) a second current path;
(iv) a second switch having an input end and output end disposed in said second current path controlling current flow in said second current path, said input end of said second switch coupled to said first current path at said output end of said first switch and said output end of said second switch coupled to a reference source, said second switch having a control input for receiving a second control voltage to control operation of said second switch, only one of said first switch and said second switch being operable to conduct in response to a voltage difference between said first and second control voltages;
(v) a first capacitor in said first current path serially coupled between said input terminal and said input end of said first switch;
(vi) a second capacitor in said second current path serially coupled between said output terminal, the output end of said first switch and the input end of said second switch; and
(vii) a third capacitor serially coupled between said output end of said second switch and said reference source.

16. The switching circuit of claim 15 wherein said first switch comprises a first transistor having a gate providing said control input for said first switch and said second switch comprises a second transistor having a gate providing said control input for said second switch.

17. The switching circuit of claim 16 wherein said first transistor further comprises a first and a second source/drain and said second transistor further comprises a first and a second source/drain, and wherein said first source/drain of said first transistor is connected to receive an input signal from said input terminal and said second source/drain of said first transistor is connected to transmit an output signal to said output terminal.

18. The switching circuit of claim 17 wherein said first source/drain of said second transistor is coupled to said second source/drain of said first transistor.

19. A switching circuit, comprising:
 (a) an input terminal, an output terminal and a floating switching circuit coupled between said input terminal and said output terminal, said floating switching circuit comprising:
  (i) a first transistor having a first and a second source/drain, said first source/drain coupled to said input terminal and said second source/drain coupled to said output terminal, said first transistor having a gate for receiving a first control voltage;
  (ii) a second transistor having a third and a fourth source/drain, said third source/drain coupled to said output terminal, said second transistor having a gate for receiving a second control voltage;
  (iii) only one of said first transistor or said second transistor being rendered conductive responsive to the difference between said first and second control voltages;
  (iv) a first capacitor serially coupled between said input terminal and said first source/drain of said first transistor to electrically isolate said input terminal from said first transistor;
  (v) a second capacitor serially coupled between said output terminal and each of said second and third source/drains to electrically isolate said output terminal from said first and second transistors; and
  (vi) a third capacitor serially coupled between said fourth source/drain and a source of reference voltage to electrically isolate said source of reference voltage from said second transistor.

* * * * *